(12) United States Patent
Roine et al.

(10) Patent No.: US 11,496,140 B2
(45) Date of Patent: Nov. 8, 2022

(54) OSCILLATOR CLOSED LOOP FREQUENCY CONTROL

(71) Applicant: TEXAS INSTRUMENTS INCORPORATED, Dallas, TX (US)

(72) Inventors: Per Torstein Roine, Oslo (NO); Danielle Lyn Griffith, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/176,329

(22) Filed: Feb. 16, 2021

(65) Prior Publication Data
US 2021/0167785 A1 Jun. 3, 2021

Related U.S. Application Data

(63) Continuation of application No. 16/362,403, filed on Mar. 22, 2019, now Pat. No. 10,924,126.

(51) Int. Cl.
*H03L 7/099* (2006.01)
*H03K 3/03* (2006.01)

(52) U.S. Cl.
CPC ......... *H03L 7/0995* (2013.01); *H03K 3/0322* (2013.01)

(58) Field of Classification Search
CPC ..... H02M 3/156; H02M 3/07; H01L 2924/00; H01L 2924/0002; H03L 7/0995; H03L 3/00; H03K 3/0322; H03K 3/011; H03K 3/0315

See application file for complete search history.

(56) References Cited

U.S. PATENT DOCUMENTS

| | | | |
|---|---|---|---|
| 6,242,898 B1 | 6/2001 | Shimizu et al. | |
| 8,810,323 B2 | 8/2014 | Ardehali | |
| 9,455,721 B2 | 9/2016 | J. et al. | |
| 9,515,667 B2 | 12/2016 | Samala et al. | |
| 10,554,218 B1* | 2/2020 | Seesink | H03F 3/45273 |
| 2002/0033739 A1 | 3/2002 | Bisanti et al. | |
| 2010/0271140 A1 | 10/2010 | Raghunathan et al. | |
| 2013/0187691 A1 | 7/2013 | Sreekiram | |
| 2014/0117956 A1* | 5/2014 | Price | G05F 1/613 323/274 |
| 2014/0327486 A1 | 11/2014 | Roine et al. | |
| 2015/0214898 A1* | 7/2015 | Fagg | H03F 1/0222 330/252 |
| 2019/0229713 A1* | 7/2019 | Krishna | H03K 3/011 |

* cited by examiner

*Primary Examiner* — Sibin Chen
(74) *Attorney, Agent, or Firm* — Carl G. Peterson; Charles A. Brill; Frank D. Cimino

(57) ABSTRACT

An electronic device comprises a regulator, and an oscillator and a resistor coupled to the regulator. The electronic device further comprises a feedback controller that includes a differential amplifier coupled between the oscillator, the resistor, and the regulator. The feedback controller is configured to apply a control voltage to the regulator in response to a resistor voltage upon the resistor and an oscillator voltage upon the oscillator. The feedback controller can be coupled to control a substantially equal voltage upon the resistor and the oscillator.

19 Claims, 6 Drawing Sheets

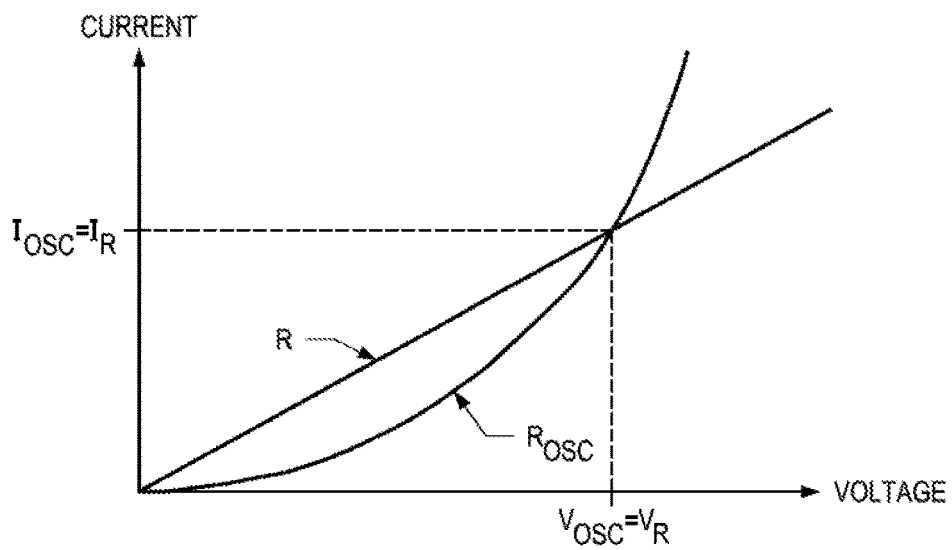
FIG. 5
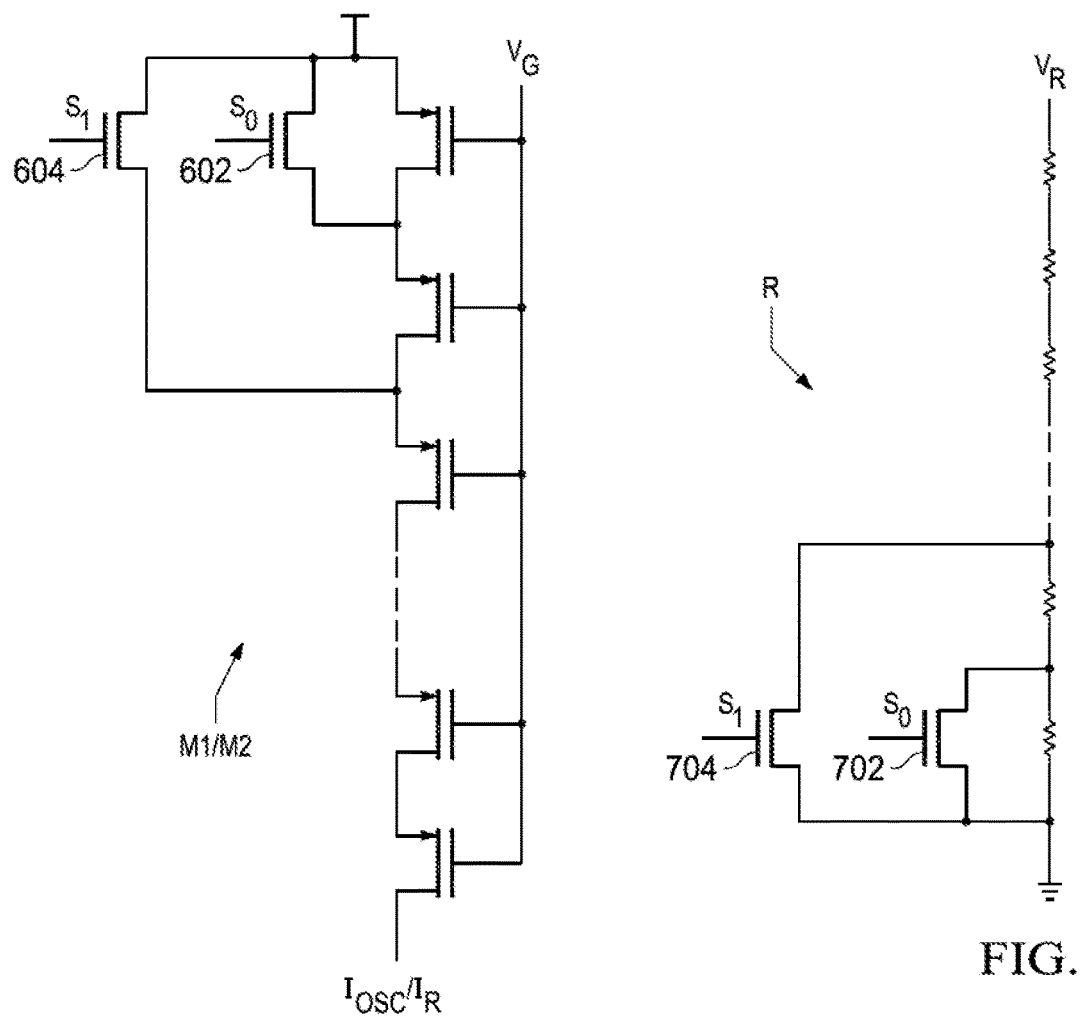
FIG. 6
FIG. 7

OSCILLATOR CLOSED LOOP FREQUENCY CONTROL

CROSS-REFERENCE TO RELATED APPLICATIONS

This application is a continuation of U.S. patent application Ser. No. 16/362,403, filed Mar. 22, 2019, which is incorporated by reference herein in its entirety.

SUMMARY

In accordance with at least one example of the disclosure, an electronic device comprises a regulator and an oscillator and a resistor coupled to the regulator. The electronic device further comprises a feedback controller that includes a differential amplifier coupled between the oscillator, the resistor and the regulator, wherein the feedback controller is configured to apply a control voltage to the regulator in response to a resistor voltage upon the resistor and an oscillator voltage upon the oscillator.

In accordance with at least one other example of the disclosure, a method comprises applying a control voltage to commonly coupled gates of a first transistor and of a second transistor. A voltage can be regulated at an output of the first transistor upon a resistor, and a voltage can be regulated at an output of the second transistor upon an oscillator. An output frequency of the oscillator can be regulated upon a clock signal when the voltage upon the resistor is substantially equal to the voltage upon the oscillator.

BRIEF DESCRIPTION OF THE DRAWINGS

For a detailed description of various examples, reference will now be made to the accompanying drawings in which:

FIG. 5 shows a graph of voltage versus current across and through an oscillator and a resistor in accordance with various examples;

FIG. 6 shows a variable transistor in accordance with various examples;

FIG. 7 shows a variable resistor in accordance with various examples;

DETAILED DESCRIPTION

Many electronic systems use a clock signal to operate. The electronic system can be incorporated into an Integrated Circuit (IC) chip or die that can include an oscillator to generate the clock signal. The clock signal output from the oscillator can oscillate at a range of frequencies that can be wide or narrow depending on the type of oscillator used.

A ring oscillator generally uses a relatively small area within the IC chip and may be operated at relatively low power levels. A ring oscillator can have a large output frequency variation, or range, depending on variations in the IC manufacturing process, supply voltage, and operating temperature. Moreover, ring oscillators may use a band gap external reference voltage to stabilize the frequency. Closed-loop control of the oscillator output is one feature that can advantageously mitigate the large frequency variations at the oscillator output. Another advantageous feature of closed loop control of the oscillator output includes avoiding band gap or external reference supplies (current and/or voltage) to assist in maintaining lower power consumption in the ring oscillator, with fine and course adjustment applied to the closed loop electronic device to minimize the effects of variations in the IC manufacturing process, supply voltage and operating temperature. An oscillator having the advantageous closed loop control absent band gap reference supplies, with fine and course adjustment of a clock signal output frequency can be applied to a Phase-Locked Loop (PLL).

Figure 1:
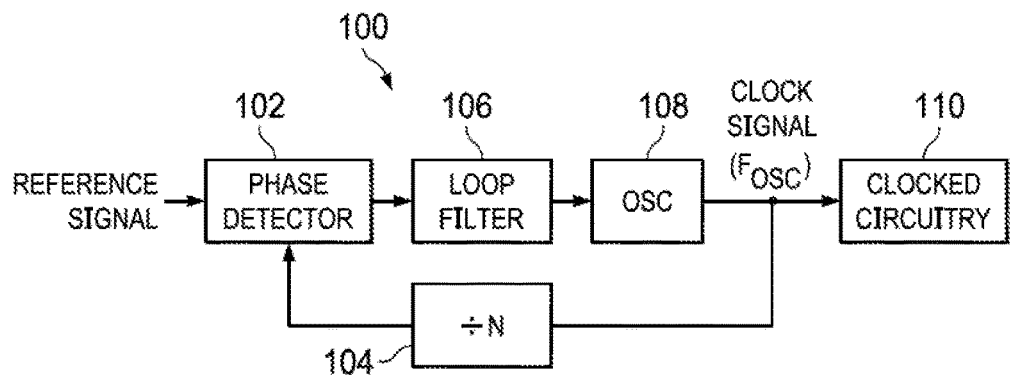
FIG. 1 shows a block diagram of a phase-locked loop (PLL) in accordance with various examples.

FIG. 1 depicts a PLL 100 in accordance with one example. PLL 100 can be implemented with digital or analog circuitry. For simplicity and brevity in the drawing, PLL 100 is shown in block form as an analog PLL with the basic operation the same as that of a digital PLL. PLL 100 operating as an analog or digital PLL can be incorporated within an electronic system that uses feedback to maintain an output signal in phase relationship with a reference signal. The output signal can be a clock signal that can be locked in a phase relationship with the reference signal. PLL 100 can be used in numerous applications, including frequency synthesizers, analog and digital modulators and demodulators, and clock recovery circuits. PLL 100 can include a phase detector 102 that produces an output voltage proportional to the phase difference between the reference signal and the clock signal. If coupled through a clock divider 104, phase detector 102 compares the reference signal to the frequency divided clock signal and generates an error signal representative of the phase error between those two signals. Phase detector 102 may contain a charge pump, and loop filter 106 can perform low-pass filtering of the error signal received at the output of phase detector 102.

Loop filter 106 can contain a voltage-to-current converter to convert the filter error signal voltage into a current, and provide that current to oscillator 108. The current fed into oscillator 108 controls the frequency of the clock signal output from the oscillator 108. Clock divider 104 divides that frequency by a desired integer value of N to generate a lower frequency clock as the feedback clock applied to phase detector 102.

Oscillator 108 can be any type of current-controlled oscillator. Alternatively, due to the resistance within oscillator 108, oscillator 108 can be controlled by voltage. If oscillator 108 is a ring oscillator, then the oscillation frequency of the clock signal can be controlled either by voltage as a Voltage Controlled Oscillator (VCO), current as a Current Controlled Oscillator (CCO), or digitally as a Digitally Controlled Oscillator (DCO). An electronic system that depends on one or more regulated clocking signals can have one or more PLLs 100, each with a corresponding oscillator 108 to produce a clock signal at a specific oscillation frequency ($F_{OSC}$) applied to sequential or clocked circuitry 110.

Although ring oscillators 108 are prevalent in PLLs 100, the $F_{OSC}$ output from oscillator 108 can have a broad output frequency variation. The variation can occur through differences in operating temperature, supply voltage, and the IC manufacturing process, as well as other external or internal factors influencing the operation of oscillator 108.

Figure 2:
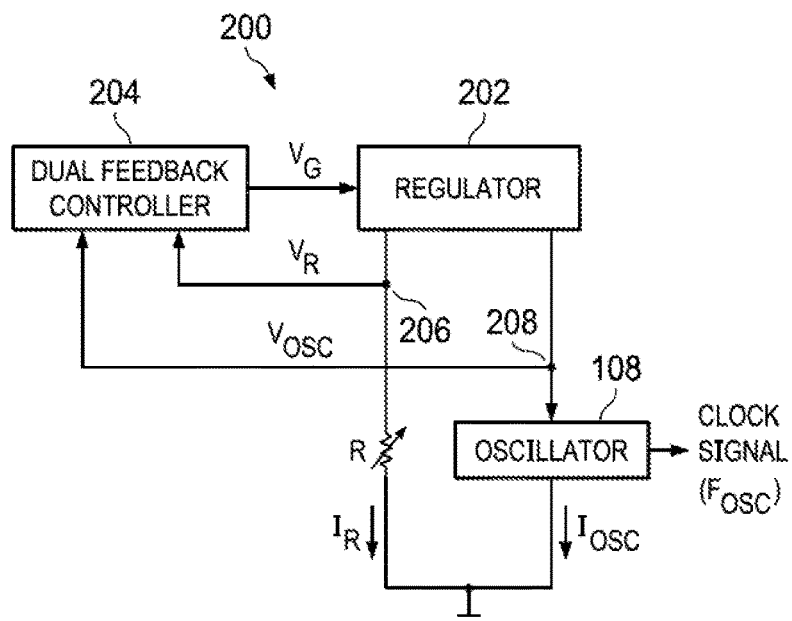
FIG. 2 shows a block diagram of an electronic device comprising an oscillator with closed loop feedback in accordance with various examples.

FIG. 2 is a block diagram of an electronic device 200 including oscillator 108 configured in a closed loop feedback arrangement. Electronic device 200 includes a regulator 202 that can be controlled by voltage to receive a control voltage $V_G$ and to generate current $I_{OSC}$ through oscillator 108 and current $I_R$ through resistor R. Oscillator 108 and resistor R are each coupled to regulator 202, and are also coupled between regulator 202 and a ground supply. A feedback controller 204 is coupled between the oscillator 108, the resistor R, and the regulator 202. Oscillator 108 can be controlled by $I_{OSC}$ as a ring oscillator, and the switched capacitor equivalent resistance of the ring oscillator 108 produces a voltage $V_{OSC}$. Resistor R can be a variable resistor that can be adjusted to a resistance value that produces $V_R$, corresponding to $I_R$, through the adjusted resistor R. Adjustment, when applied to a resistance value of R, can occur once or may be repeated periodically. Trimming and adjusting are oftentimes interchangeably used, where either can occur one time or frequently and periodically. Variable resistor R can undergo periodic and sometimes frequent trimming or adjustment by applying a voltage to a gate of shorting transistors (not pictured in FIG. 2, but shown in FIG. 7) whenever changes to the resistance value are needed. Voltage $V_R$ on a first node 206 is fed back to the feedback controller 204, and $V_{OSC}$ on second node 208 is also fed back to the feedback controller 204. Feedback of voltage $V_R$ and $V_{OSC}$ from the first and second nodes 206, 208 onto the feedback controller 204 produces a control voltage $V_G$ input onto regulator 202 to complete the closed loop dual feedback of voltages $V_R$ and $V_{OSC}$. The closed loop dual feedback architecture produces an output frequency $F_{OSC}$ at the output of oscillator 108 that is inversely dependent on the value of the adjustable, variable resistor R and the capacitance value of the switched capacitor ring oscillator 108. The output frequency $F_{OSC}$ produced from oscillator 108 is substantially independent of any transistor process variation, and temperature and supply voltage fluctuation of the IC.

Figure 3:
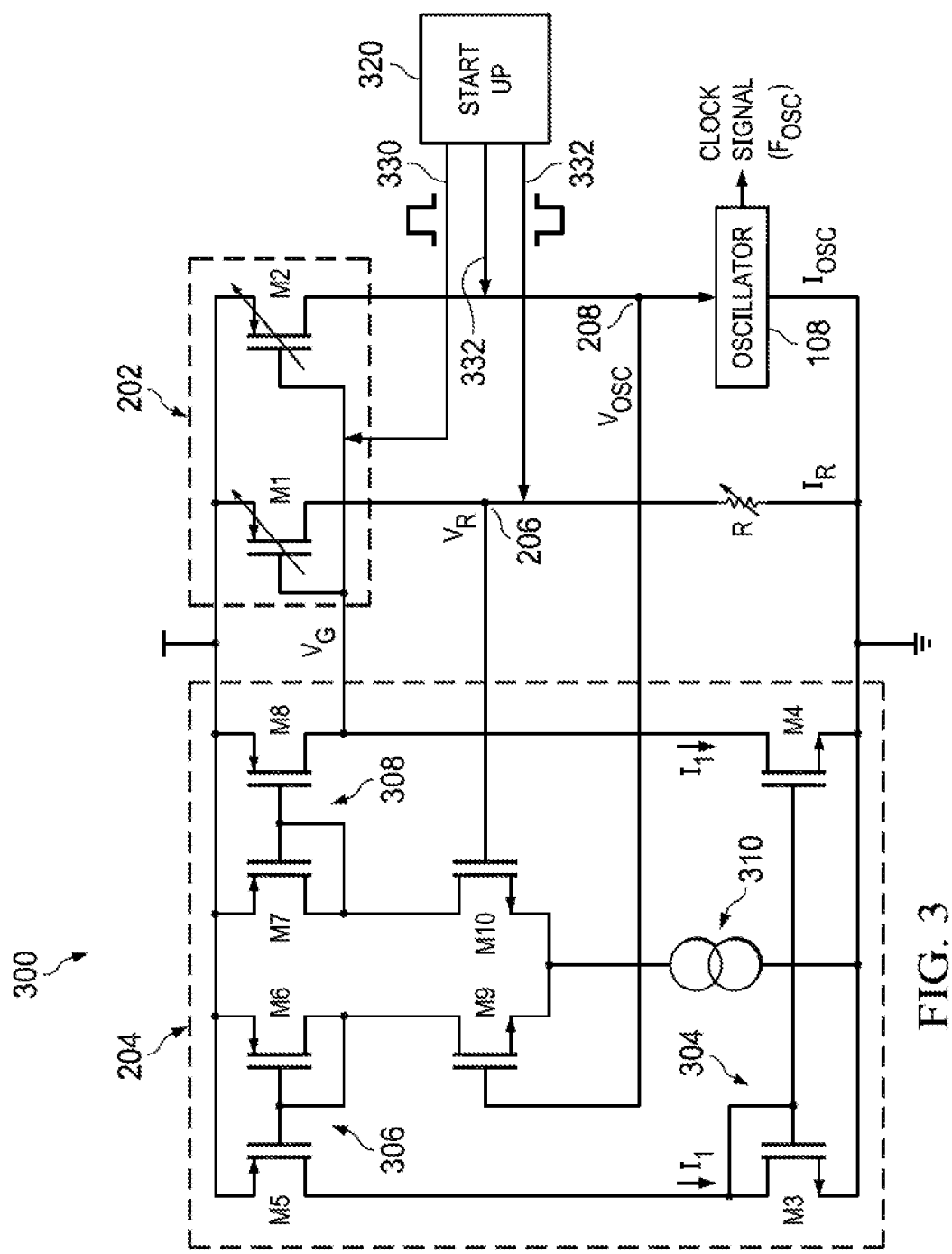
FIG. 3 shows a circuit diagram of the electronic device comprising an oscillator with closed loop feedback in accordance with various examples.

FIG. 3 shows a circuit diagram of electronic device 300 comprising regulator 202 and feedback controller 204 configured according to one example. Regulator 202 can include a pair of current sources that includes a first transistor M1 and a second transistor M2. Transistor M1 may be coupled in series with resistor R. Transistor M2 may be coupled in series with oscillator 108. The current sources are configured to receive the control voltage $V_G$ applied to gates of the transistors M1 and M2. The transistors M1, M2 can be Metal Oxide Semiconductor Field Effect Transistors (MOSFETs). Transistors M1 and M2 can be coupled between a power supply and first and second nodes 206, 208. If connected to the power supply, transistors M1 and M2 can be P-channel MOSFET transistors that are activated when the control voltage $V_G$ drops below a threshold amount less than the supply voltage.

While both transistors M1 and M2 can be activated at substantially the same time when the control voltage $V_G$ is provided at a threshold below the supply voltage, the amount of drive current through transistors M1 and M2 can vary depending on how those transistors are sized in width verses length, or are adjusted. Transistors M1 and M2 can be variable transistors that can be adjusted by applying a logic 1 or logic 0 to one or more bypass transistors to change the drive current $I_R$ through resistor R and to change $I_{OSC}$ through oscillator 108. According to one example, transistor M1 can be adjusted or trimmed once, whereas transistor M2 can be periodically and frequently changed to maintain lock of the PLL. Regulator 202 regulates the amount of drive current $I_R$ and $I_{OSC}$ depending not only on the control voltage $V_G$ but also on the amount of change applied to transistors M1 and M2, or the width/length design of transistors M1 and M2. A ratio of the resulting change on variable transistors M1 and M2 can have a direct impact on $F_{OSC}$. For example, as noted below, the greater the amount of change on transistor M2 relative to transistor M1 the greater is $F_{OSC}$.

Feedback controller 204 can be configured to produce a control voltage $V_G$ from input voltages $V_R$ and $V_{OSC}$. One way to generate the control voltage $V_G$ is through use of three current mirrors 304, 306, and 308, as well as the differential amplifier comprising transistors M9 and M10. The first current mirror 306 includes transistors M4 and M6, the second current mirror 308 includes transistors M7 and M8, and the third current mirror 304 includes transistors M3 and M4. A current source 310 is coupled to the differential amplifier configured pair of transistors M9 and M10, and the differential amplifier amplifies the difference between the input voltages $V_R$ and $V_{OSC}$. Current mirrors 306 and 308 mirror the output currents from the drains of transistors M9 and M10. The current mirror 304 mirrors the same current $I_1$ on both transistors M3 and M4 source-to-drain paths, and the control voltage $V_G$ is controlled to the correct value to ensure that $V_R$ is made equal to $V_{OSC}$ when the output frequency of the oscillator 108 is in regulation. Similar to transistors M1 and M2, transistors M3-M10 can be MOSFETS, with some transistors being p-channel MOSFETs and others being n-channel MOSFETs.

Feedback controller 204 is one example of a dual feedback control circuit implementation, and can use an amplifier and current mirrors and other electrical components to generate the control voltage $V_G$, with voltage $V_G$ dependent on the difference between $V_R$ and $V_{OSC}$. Feedback controller 204 controls $V_G$ based on the difference between $V_R$ and $V_{OSC}$ using, for example, one or more differential amplifiers and current mirrors so that $V_{OSC}$ is closed-loop controlled through feedback. The closed-loop control mechanism will therefore control $V_G$ so that oscillator 108 is in regulation when $V_{OSC}$ is substantially equal to $V_R$. Also, when in regulation, the mirrored current $I_1$ within feedback controller 204 can be equal throughout when $V_R = V_{OSC}$ and drive current of M9 is controlled to be substantially equal to the drive current of M10.

A start up circuit 320 can be provided according to one example. Start up circuit 320 can be designed to begin oscillation, or maintain oscillation, of oscillator 108. One way to begin oscillation is to insert a negative or logic zero pulse upon the gates of transistors M1 and M2 as shown by the upper arrow 330 in FIG. 3. The logic zero pulse will drive current through the source-to-drain paths of transistors M1 and M2, thereby generating a positive $V_{OSC}$ and $V_R$. Since oscillator 108 can be current or voltage controlled, current applied to oscillator 108 or resistor R can initiate oscillator 108. Alternatively, a leakage current can be placed into nodes 206 and 208 shown by the arrows 332 in FIG. 3. The leakage currents from start up circuit 320 to nodes 206 and 208 can include a positive or a logic one voltage value so the nodes 206 and 208 are maintained above a logic zero value.

Current applied to oscillator 108, or voltage at node 208, will initiate or maintain oscillation. A leakage current maintained on nodes 206 and 208 from start up circuit 320 ensures appropriate voltages are at nodes 206 and 208 to maintain oscillation, albeit not in regulation. There can be other mechanisms for start up circuit 320 to initiate start up or maintain a start up current or voltage on oscillator 108.

Figure 4:
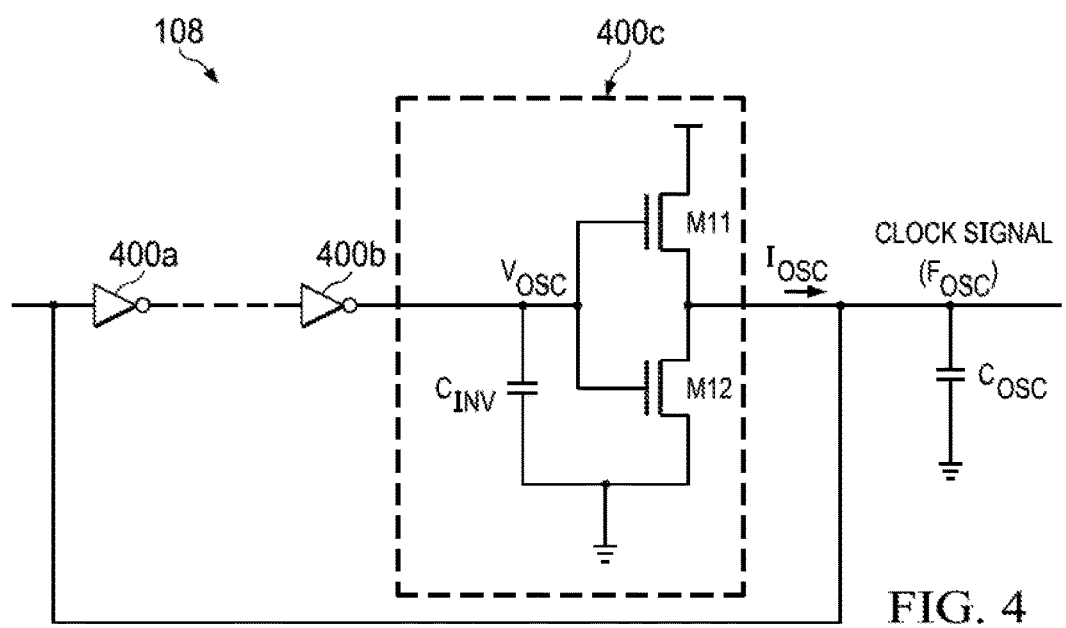
FIG. 4 shows a circuit diagram of an oscillator in accordance with various examples.

FIG. 4 illustrates oscillator 108, according to one example. Oscillator 108 can be a ring oscillator that may include an odd or even number of inverters. In the example of FIG. 4, three inverter gain stages 400a, 400b and 400c are shown. However, there can be more than three inverters coupled in series with the last inverter gain stage 400 having an output coupled to an input of the first inverter gain stage 400. A ring oscillator 108 can be single-ended. To eliminate common mode noise, two or more inverters can be used, with each inverter gain stage 400 having a differential inverting gain stage. Each inverter gain stage 400, whether single-ended or differential, forms an inverting gain stage. The frequency $F_{OSC}$ of the clock signal generated from oscillator 108 can increase if the number of inverter stages decreases and/or the time delay of each inverter gain stage decreases.

As shown in more detail in FIG. 4, the load on the output and input of each inverter gain stage 400 can be modeled by a capacitance Cinv. For example capacitance Cinv comprises input capacitance of the inverter implemented as a pair of transistors M11 and M12. Shown in dashed line is an example of inverter 400c having transistors M11 and M12. The other inverters may also have corresponding pairs of inverters, with an input capacitance of the following inverter plus any added capacitor that may be coupled to each inverter gain stage 400. As the oscillator 108 oscillates, capacitance of Cinv is charged and discharged through the transistors M11 and M12 of the associated inverter gain stage 400. The current required to charge the capacitance Cinv between a ground and $V_{OSC}$ is Cinv*dV/dt where dV/dt is the rate of change of the inverter stage 400 output voltage with time. Thus, the current consumption of oscillator 108 is the sum of the currents in each inverter stage 400, and $I_{OSC}=F_{OSC}*V_{OSC}*C_{OSC}$ where $C_{OSC}$ is the equivalent, cumulative capacitance that must be charged by all of the inverter stages 400 of Cinv. Accordingly, oscillator 108 has a cumulative capacitance $C_{OSC}$ of multiple Cinvs within each stage 400 added together and applied to oscillator 108 output, as shown in FIG. 4. Rearranging the equation above to solve for a resistance value, V/I, the equivalent resistance of the ring oscillator 108 can be represented as $R_{OSC}=1/(F_{OSC}*C_{OSC})$.

FIG. 5 illustrates a graph of voltage vs. current across and through an oscillator 108 (FIGS. 2-4) and resistor R. The voltage across oscillator 108 is equal to $V_{OSC}$, and the voltage across resistor R is equal to $V_R$. The current through oscillator 108 of FIGS. 2-4 is $I_{OSC}$, and the current through resistor R is $I_R$. The resistor R has a resistance value of R, and the oscillator 108 of FIGS. 2-4 has an equivalent resistance value $R_{OSC}$. FIG. 5 illustrates that when $V_{OSC}$ is equal to the voltage across resistor R (or $V_R$), the electronic device 300 shown in FIG. 3 is in regulation. When in regulation, $V_{OSC}$ is substantially equal to $V_R$, and also $I_{OSC}$ is substantially equal to $I_R$. In this fashion, the linear relationship of voltage to current corresponding to resistor R and the non-linear relationship of the switched capacitor equivalent resistance (or $R_{OSC}$) of the oscillator 108 of FIGS. 2-4 intersect.

Given that $F_{OSC}=I_{OSC}/(V_{OSC}*C_{OSC})$, when $I_{OSC}=I_R$ and $V_{OSC}=V_R$, then knowing $I_R*R=V_R$, $F_{OSC}$ becomes dependent on or proportional to $1/(R*C_{OSC})$. The frequency of the clock signal $F_{OSC}$ from oscillator 108 in the closed-loop electronic device 300 of FIG. 3 is dependent on or proportional to an inverse of the product of the resistance value of resistor R and the capacitance value $C_{OSC}$ of the cumulative Cinv among the inverter stages of the oscillator 108.

Because $F_{OSC}$ is proportional to an inverse of the product of resistance value R and the oscillator capacitance value $C_{OSC}$, $F_{OSC}$ can be tuned based in part on adjusting the variable resistor R. $F_{OSC}$ can be inversely proportional to the product of $R_{OSC}$ and $C_{OSC}$. Adjusting the variable resistor R allows the oscillator frequency $F_{OSC}$ to be controlled without requiring a reference current whose value will vary as a function of supply voltage. However, regulator 202 in the electronic device 300 of FIG. 3 allows for additional tuning of $F_{OSC}$ by adjusting the variable transistors M1 and M2. Adjusting the resistor R or transistors M1 and M2 is more power efficient than adjusting the capacitance $C_{OSC}$ which increases the power consumption when a larger capacitance value is used.

FIG. 6 illustrates one possible implementation of the variable transistor M1 and the variable transistor M2. One or more transistors within a series of transistors can include a bypass transistor. In the example of FIG. 6, two bypass transistors 602 and 604 are coupled to the source-to-drain paths of one or more transistors within the variable transistor M1 or M2. By applying a logic 1 or logic 0 to one or more bypass transistors 602, 604, the source-to-drain paths transistors within the chain can be shorted. Shorting one or more transistors within the chain can increase $I_R$ from the variable transistor M1 or increase $I_{OSC}$ from the variable transistor M2. Increasing $I_{OSC}$ can increase $F_{OSC}$ as shown in the above equations.

One possible implementation of a variable resistor is shown in FIG. 7. One or more bypass transistors 702, 704 can also be coupled to the variable resistor R in FIG. 7. By shorting one or more of the resistors coupled in series within the chain, the resistance value of variable resistor R will decrease. From the above equations, a decrease in the resistor value of the variable resistor R will increase $F_{OSC}$. Similar to FIG. 6, coupling the resistors or transistors in a chain and using bypass transistors to short one or more resistors or transistors to modify $F_{OSC}$ is only one example of a variable resistor R or variable transistors M1 and M2. Variable resistor R and transistors M1 or M2 can be implemented in other ways besides that shown in FIGS. 6 and 7.

PLL applications typically need a digitally controlled oscillator whose frequency can be adjusted in three ways. A first way is to adjust as a function of the process corner to compensate for variations that occur during device fabrication. The second way is to implement a coarse adjustment to select the PLL operating frequency, typically over a wide range, for example 30% to 300% depending on the application. The third way is implement a fine adjustment which is used to keep the PLL locked as voltage and temperature changes. This range is typically from a few percent to 30%, with a fine step size needed to reduce the PLL jitter while locked. The architecture shown in FIG. 3 can be combined with the control methods shown in FIG. 6 and FIG. 7 to implement the three independent frequency control methods.

Figure 8:
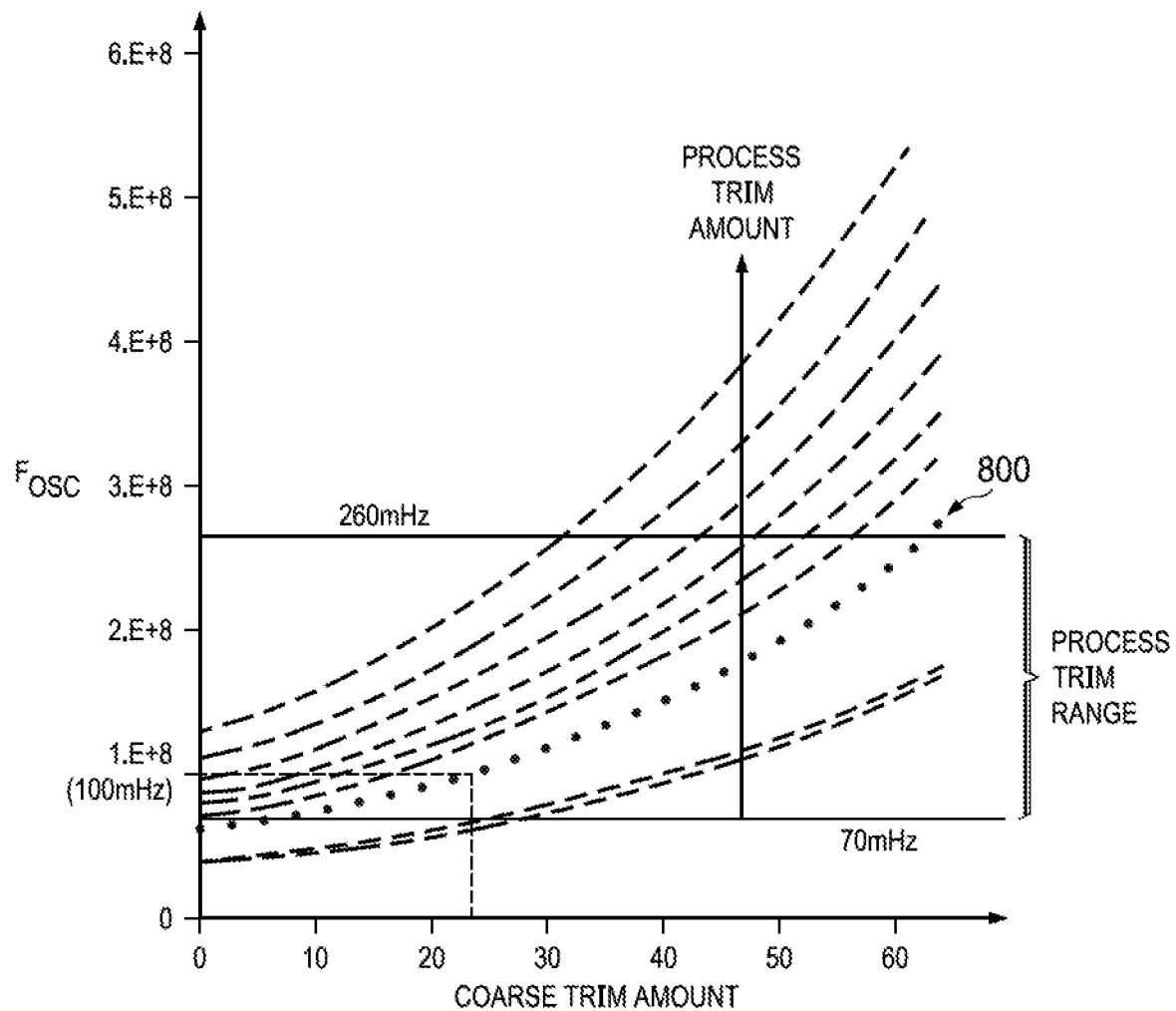
FIG. 8 shows a graph of resistor adjustment amounts versus oscillator frequency for different transistor adjustment amounts in accordance with various examples.

FIG. 8 shows a graph of variable resistor R with change amounts shown as the "coarse trim amount." As more resistors in the series-connected resistors of variable resistor R are shorted (i.e., adjusted or trimmed) the graph in FIG. 8 illustrates an increase in $F_{OSC}$. However, prior to performing any adjustment of the variable resistor R, the user can apply bit logic values $S_0$ and $S_1$, for example, to bypass transistors 602 and 604 of FIG. 6 of variable transistor M1. Adjusting transistor M1 is referred to as "process trim" and, depending on the quantity of transistors in the series being adjusted possibly one time or many times, a "process trim amount" is produced. For example, the oscillator 108 of FIGS. 2-4, and PLL 100 of FIG. 1, can be designed to operate within a process trim range. As shown in the example of FIG. 8, the process adjustment range might be set to a relatively high $F_{OSC}$ range of approximately 70 MHz to approximately 260 MHz. The process adjustment amount for transistor M1 is used to select the curve having the best fit among the plurality of curves shown. The best fit curve between the desired range of 70 MHz and 260 MHz can be that displayed with dots rather than dashes, and illustrated as curve 800. Appropriately, more of curve 800 is within the process adjustment range than other curves shown in dashed line. Therefore, the amount of change on transistor M1, for example, will set curve 800.

Knowing the appropriate process adjustment amount used to generate curve 800, the series-connected variable resistor R can then be adjusted by a coarse trim amount to set the actual $F_{OSC}$ along curve 800. For example, if a customer desires 100 MHz, then from curve 800, the tune frequency of 100 MHz can be realized by coarse adjustment of the variable resistor R by shorting a number of resistors shown on the x axis of FIG. 8. In the example shown, approximately 22 resistors in the series of resistors can be shorted.

Through process and coarse trimming or adjusting of respective variable transistor M1 and variable resistor R, the oscillator output frequency $F_{OSC}$ can be defined to a relatively small range of output frequencies. That range can be, for example, less than ten percent from the desired $F_{OSC}$. To achieve a range less than ten percent, and possibly less than 0.15 percent of the desired $F_{OSC}$, adjustment of transistor M2 can also take place. Transistor M2 can be changed frequently and periodically provides a "fine adjustment amount" used to maintain PLL lock. Adjustment of transistor M2 can be performed similarly to that of transistor M1 by periodically shorting one or more transistors (the same transistors or different transistors) within a series-connected set of transistors controlled by control voltage $V_G$.

The process trim of transistor M1, followed by coarse trim of resistor R, possibly followed by fine, periodic adjustment of transistor M1, along with the dual feedback control and regulation, maintains narrow control of a desired $F_{OSC}$. Changing of transistors M1 and M2, or resistor R, need not take place to realize the benefits of tight control of $F_{OSC}$. However, if adjustment is implemented due to relatively large IC process fluctuation, then a process trim can occur, possibly followed by a coarse trim. If further changes are needed to maintain the PLL lock, for example, then a fine adjustment can also be periodically and frequently applied to transistor M2. Using, for example, only the fine adjustment, a frequency step size can be less than 0.1 percent. The coarse and process trims may be needed to set the frequency that the fine adjustment 0.1 percent step size occurs around. Moreover, if a process trim of transistor M1 is used, then the process trim of transistor M1 need only occur one time, and at room temperature. The coarse adjustment or trim can occur whenever a user wishes to select a new PLL frequency, and may be done one time, or more frequently depending on the application.

With or without trimming or adjustment, the ring oscillator 108 avoids use of any capacitor arrays and, thus, has a lower power consumption than other types of oscillators. The electronic device 300 with closed-loop feedback need not employ any voltage or current references and therefore has a relatively small area, low power budget, fast start up, and no needed band gap. The variable resistor can be a zero temperature coefficient resistor array. The coarse trim can select the desired operating frequency range, and the fine trim can be used to maintain PLL lock at this desired frequency as temperature and/or voltage change. The electronic device 300 of FIG. 3 is not only substantially temperature and process independent, but also power supply insensitive due in part to the closed-loop feedback arrangement.

Figure 9:
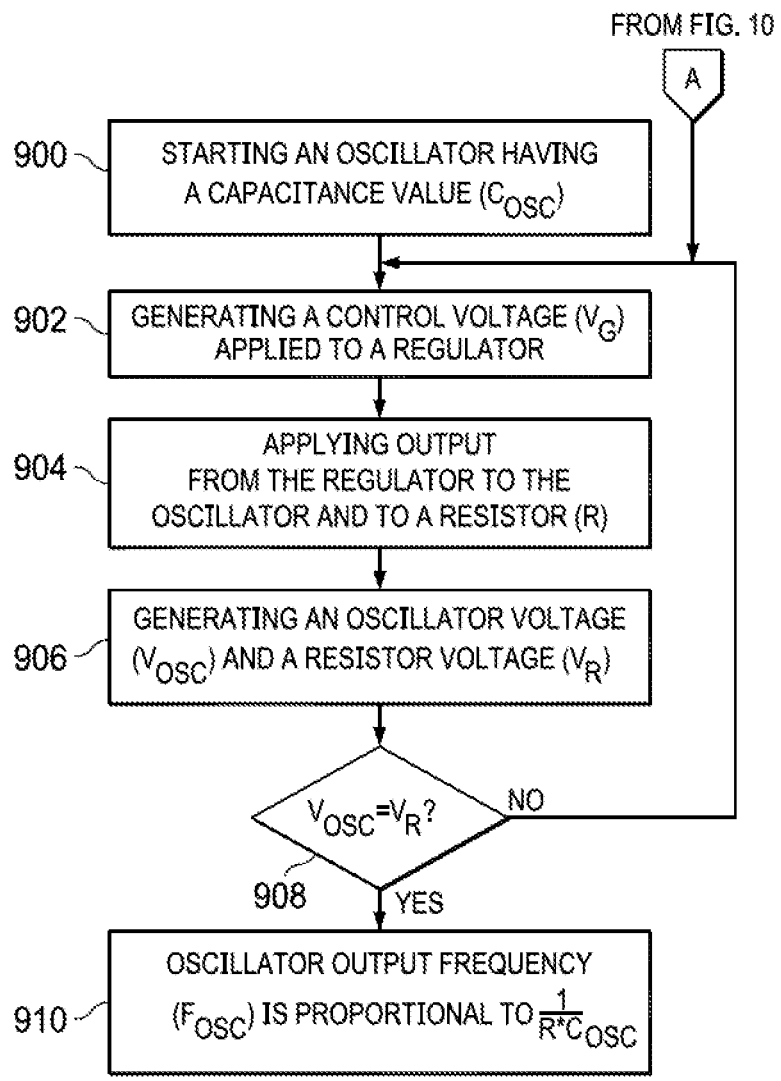
FIG. 9 shows a flow diagram of a method for regulating an output frequency of an oscillator in accordance with various examples.

FIG. 9 shows a flow diagram as a method for regulating the output frequency $F_{OSC}$ of the oscillator 108 in accordance with one example. The oscillator can be started 900 using a start up circuit, or any other oscillation startup or oscillation maintaining mechanism, and the oscillator includes a capacitor having a capacitance value $C_{OSC}$. A control voltage $V_G$ is applied to the regulator at block 902, and an oscillator current $I_{OSC}$ is generated and provided to the oscillator at block 904 which creates oscillator voltage $V_{OSC}$ at block 906. The current $I_R$ is also generated and provided to resistor R to create voltage $V_R$ at blocks 904 and 906. Through feedback from the oscillator and the variable resistor R, a control voltage $V_G$ is generated 902.

If $V_{OSC}$ is equal to $V_R$ at decision block 908, then the oscillator is in regulation 910 and the oscillator output frequency $F_{OSC}$ is dependent on or proportional to $1/(R*C_{OSC})$. If $V_{OSC}$ is not equal to $V_R$, then the process is returned back to block 902.

Figure 10:
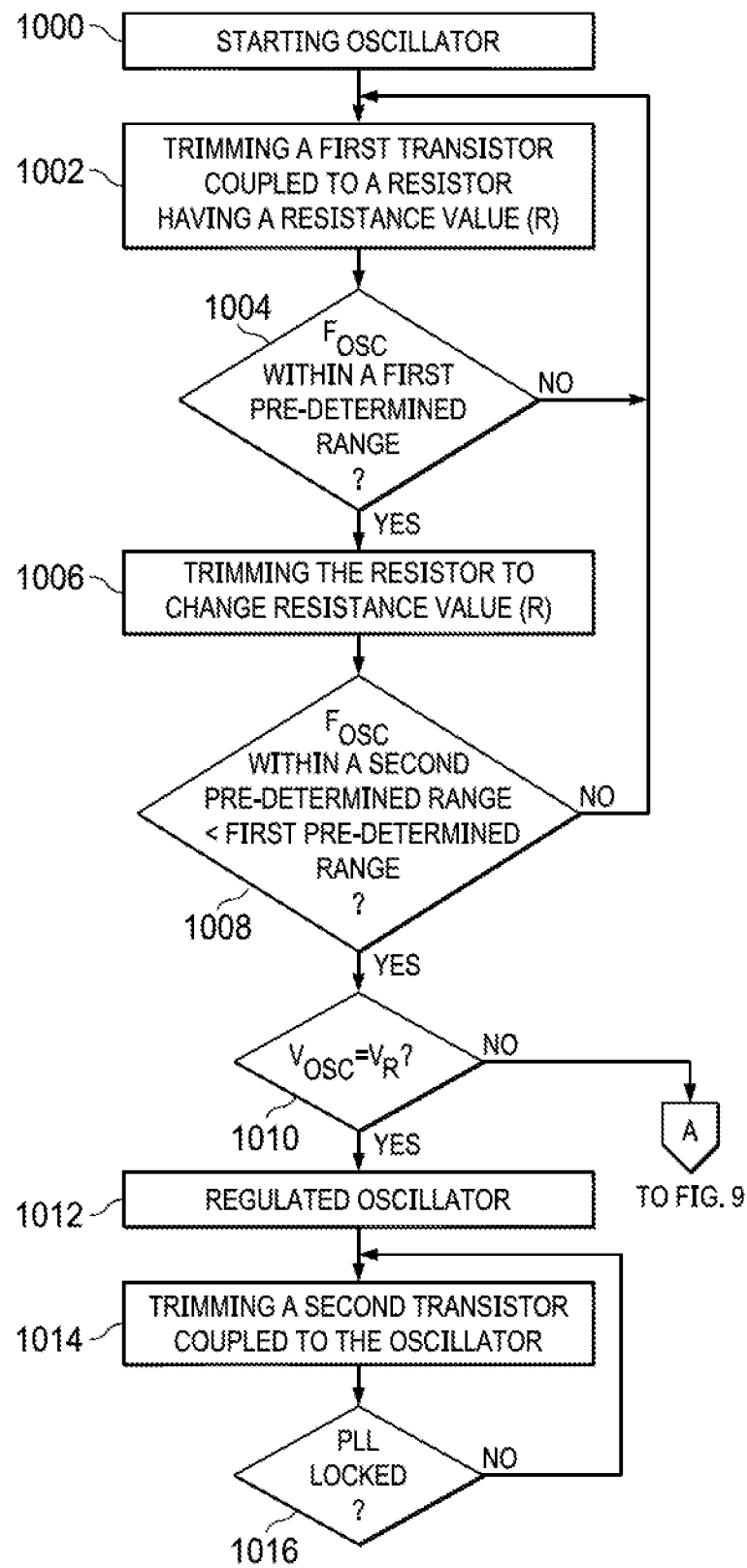
FIG. 10 shows a flow diagram of a method for adjusting at least one transistor and a resistor for regulating an output frequency of an oscillator in accordance with various examples.

FIG. 10 shows a flow diagram of a method for adjusting or trimming at least one transistor and a resistor for further regulating an output frequency $F_{OSC}$ of an oscillator. Once the oscillator is started 1000, then a first transistor M1 coupled to resistor R can be trimmed in the block 1002. The process trimming of transistor M1 of block 1002 sets the appropriate curve within a defined process trim range to determine if $F_{OSC}$ is within that first pre-determined range or process trim range 1004. If a curve cannot be determined within a first pre-determined range, then trimming of the first transistor M1 is repeated. If a curve can be determined within the first pre-determined range, then the coarse trimming of the resistor R can be undertaken to change the resistance value of resistor R at block 1006.

Resulting from the trimming of the resistor R, if $F_{OSC}$ is within a second pre-determined range less than the first pre-determined range at block 1008, then a determination may be undertaken at block 1010 as to whether $V_{OSC}$ is equal to $V_R$. If $V_{OSC}$ is equal to $V_R$, then the oscillator is in regulation as shown by block 1012, and adjusting of a second transistor M2 coupled to the oscillator can occur at block 1014 to determine if the PLL is maintained locked at block 1016. If $V_{OSC}$ is not equal to $V_R$, then further feedback control may be needed by returning to block 902 of FIG. 9, for example. If the PLL is not locked, then trimming of the second transistor can be repeated by a different amount.

In the foregoing discussion and in the claims, the terms "including" and "comprising" are used in an open-ended fashion, and thus should be interpreted to mean "including, but not limited to . . . ." Also, the terms "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrase "ground," or similar, in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value. It is also understood that use of the word "equal" is interchangeably understood as approximately equal to substantially equal.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electronic device, comprising:
   a regulator comprising:
      a first variable transistor coupled to a first node to receive a gate voltage and comprising a first bypass transistor; and
      a second variable transistor coupled to the first node to receive the gate voltage and comprising a second bypass transistor;
   an oscillator coupled to the first variable transistor of the regulator at a second node;
   a variable resistor coupled to the second variable transistor of the regulator at a third node; and
   a feedback controller comprising a differential amplifier that includes:
      a first transistor that includes a gate coupled to the oscillator at the second node to receive an oscillator voltage;
      a second transistor that includes a gate coupled to the variable resistor at the third node to receive a resistor voltage; and
      a third transistor and a fourth transistor coupled in series between a voltage supply node and a ground node, wherein the third transistor is coupled to the first node to provide the gate voltage and includes a gate coupled to the second transistor.

2. The electronic device of claim 1, wherein the first variable transistor is configured to produce the resistor voltage in response to the gate voltage, and wherein the second variable transistor is configured to produce the oscillator voltage in response to the gate voltage.

3. The electronic device of claim 1, wherein the oscillator comprises a plurality of gain stages arranged to produce an oscillation, the oscillator having a capacitance.

4. The electronic device of claim 3, wherein the oscillator is configured to produce a clock signal having a frequency that is an inverse function of a resistance value of the variable resistor and the capacitance.

5. The electronic device of claim 4, wherein the inverse function comprises an inverse product of the resistance value and the capacitance.

6. An electronic device, comprising:
   a regulator comprising:
      a first variable transistor comprising a first bypass transistor and a first set of transistors coupled in series between a voltage supply node and a first node that each include a gate coupled to a second node; and
      a second variable transistor comprising a second bypass transistor and a second set of transistors coupled in series between the voltage supply node and a third node that each include a gate coupled to the second node;
   a variable resistor coupled to the first variable transistor at the first node;
   an oscillator coupled to the second variable transistor at the third node; and
   a feedback controller comprising:
      a first transistor that includes a gate coupled to the first node;
      a second transistor that includes a gate coupled to the third node;
      a third transistor coupled between the voltage supply node and the second node; and
      a fourth transistor coupled between the second node and a ground node.

7. The electronic device of claim 6, wherein the oscillator comprises inverter stages having a cumulative capacitance.

8. The electronic device of claim 7, wherein a frequency produced from the oscillator is inversely proportional to a product of the cumulative capacitance and a resistance of the variable resistor.

9. The electronic device of claim 6, wherein the first variable transistor comprises a first current path coupled to the variable resistor, and wherein the second variable transistor comprises a second current path coupled to the oscillator.

10. The electronic device of claim 9, wherein the first current path is digitally selectable, and wherein the second current path is digitally selectable.

11. A device comprising:
   a regulator that includes:
      a first variable transistor coupled between a voltage supply node and a first node and that includes a gate coupled to a second node; and
      a second variable transistor coupled between the voltage supply node and a third node and that includes a gate coupled to the second node;
   a controller coupled to the regulator that includes:
      a first transistor that includes a gate coupled to the first node;
      a second transistor coupled to the first transistor that includes a gate coupled to the third node;
      a third transistor coupled between the voltage supply node and the second node; and
      a fourth transistor coupled between the second node and a ground node; and
   an oscillator coupled between the third node and the ground node.

12. The device of claim 11, wherein the controller includes a current source coupled between the first transistor and the ground node and coupled between the second transistor and the ground node.

13. The device of claim 11, wherein:

the controller includes a fifth transistor coupled between the voltage supply node and the first transistor such that a fourth node is between the fifth transistor and the first transistor;

the fifth transistor includes a gate coupled to the fourth node; and the third transistor includes a gate coupled to the fourth node.

14. The device of claim 13, wherein:

the controller includes a sixth transistor coupled between the voltage supply node and the second transistor such that a fifth node is between the sixth transistor and the second transistor; and the sixth transistor includes a gate coupled to the fifth node.

15. The device of claim 14, wherein:

the controller includes:

a seventh transistor coupled between the voltage supply node and a sixth node; and an eighth transistor coupled between the sixth node and the ground node; and the eighth transistor includes a gate coupled to the sixth node.

16. The device of claim 15, wherein the fourth transistor includes a gate coupled to the sixth node.

17. The device of claim 11, wherein the first variable transistor includes a set of transistors coupled in series between the voltage supply node and the first node that each include a gate coupled to the second node.

18. The device of claim 17, wherein the first variable transistor includes a bypass transistor coupled in parallel with at least one transistor of the set of transistors.

19. The device of claim 11 further comprising a resistor coupled between the first node and the ground node.

* * * * *